United States Patent
Roh et al.

(10) Patent No.: US 9,853,152 B1
(45) Date of Patent: Dec. 26, 2017

(54) FIN FIELD EFFECT TRANSISTORS (FETS) (FINFETS) EMPLOYING DIELECTRIC MATERIAL LAYERS TO APPLY STRESS TO CHANNEL REGIONS

(71) Applicant: QUALCOMM Incorporated, San Diego, CA (US)

(72) Inventors: Ukjin Roh, San Diego, CA (US); Youn Sung Choi, San Diego, CA (US); Shashank Ekbote, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/266,840

(22) Filed: Sep. 15, 2016

(51) Int. Cl.
| | |
|---|---|
| H01L 29/78 | (2006.01) |
| H01L 27/02 | (2006.01) |
| H01L 27/088 | (2006.01) |
| H01L 21/8234 | (2006.01) |
| H01L 21/306 | (2006.01) |
| H01L 29/08 | (2006.01) |
| H01L 21/02 | (2006.01) |
| H01L 29/417 | (2006.01) |
| H01L 21/84 | (2006.01) |
| H01L 27/092 | (2006.01) |
| H01L 27/12 | (2006.01) |

(Continued)

(52) U.S. Cl.
CPC .... *H01L 29/7846* (2013.01); *H01L 21/02271* (2013.01); *H01L 21/30604* (2013.01); *H01L 21/823418* (2013.01); *H01L 21/823431* (2013.01); *H01L 21/823437* (2013.01); *H01L 21/823481* (2013.01); *H01L 21/823821* (2013.01); *H01L 21/845* (2013.01); *H01L 27/0207* (2013.01); *H01L 27/0886* (2013.01); *H01L 27/0924* (2013.01); *H01L 27/10826* (2013.01); *H01L 27/10879* (2013.01); *H01L 27/1211* (2013.01); *H01L 29/0847* (2013.01); *H01L 29/41791* (2013.01); *H01L 29/66795* (2013.01); *H01L 29/785* (2013.01); *H01L 29/7851* (2013.01)

(58) Field of Classification Search
None
See application file for complete search history.

(56) References Cited

U.S. PATENT DOCUMENTS

| | | |
|---|---|---|
| 7,081,395 B2 | 7/2006 | Chi et al. |
| 8,329,531 B2 | 12/2012 | Hoentschel et al. |

(Continued)

*Primary Examiner* — Minh-Loan Tran
(74) *Attorney, Agent, or Firm* — Withrow & Terranova, PLLC

(57) ABSTRACT

Fin Field Effect transistors (FETs) (FinFETs) employing dielectric material layers to apply stress to channel regions are disclosed. In one aspect, a FinFET is provided that includes a substrate and a Fin disposed over the substrate. The Fin includes a source, a drain, and a channel region between the source and drain. A gate is disposed around the channel region. To apply stress to the channel region, a first dielectric material layer is disposed over the substrate and adjacent to one side of the Fin. A second dielectric material layer is disposed over the substrate and adjacent to another side of the Fin. The dielectric material layers apply stress along the Fin, including the channel region. The level of stress applied by the dielectric material layers is not dependent on the volume of each layer.

23 Claims, 10 Drawing Sheets

(51) Int. Cl.
*H01L 27/108* (2006.01)
*H01L 21/8238* (2006.01)
*H01L 29/66* (2006.01)

(56) References Cited

U.S. PATENT DOCUMENTS

| | | |
|---|---|---|
| 8,334,570 B2 | 12/2012 | Xu et al. |
| 8,349,668 B2 | 1/2013 | Moroz et al. |
| 9,263,585 B2 * | 2/2016 | Pham ................ H01L 29/66795 |
| 9,306,067 B2 | 4/2016 | Ching et al. |
| 9,614,086 B1 * | 4/2017 | Yeo .................... H01L 29/7849 |
| 9,722,078 B2 * | 8/2017 | Chiu .................. H01L 29/7848 |
| 2015/0311212 A1 | 10/2015 | Ching et al. |

* cited by examiner

FIN FIELD EFFECT TRANSISTORS (FETS) (FINFETS) EMPLOYING DIELECTRIC MATERIAL LAYERS TO APPLY STRESS TO CHANNEL REGIONS

BACKGROUND

I. Field of the Disclosure

The technology of the disclosure relates generally to Fin Field Effect transistors (FETs) (FinFETs), and particularly to applying stress to a channel region of a FinFET.

II. Background

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices.

As electronic devices become more complex in functionality, so does the need to include a greater number of transistors in such devices. However, as electronic devices are required to be provided in increasingly smaller packages, such as in mobile devices, for example, there is a need to provide a greater number of transistors in a smaller IC chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) and providing smaller parasitic capacitances resulting in reduced circuit delay. However, as channel length in planar transistors is reduced such that the channel length approaches a magnitude similar to the depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths).

In this regard, to address the need to scale down channel lengths in transistors while avoiding or mitigating SCEs, transistor designs alternative to planar transistors have been developed. One such alternative transistor design includes a Fin Field Effect transistor (FET) (FinFET) that provides a conducting channel via a "Fin" formed from a substrate. Material is wrapped around the Fin to form the gate of the device. For example, FIG. 1 illustrates an exemplary FinFET 100. The FinFET 100 includes a substrate 102 and a Fin 104 formed from the substrate 102. An oxide layer 106 is included on either side of the Fin 104. The FinFET 100 includes a source 108 and a drain 110 interconnected by the Fin 104 such that an interior portion of the Fin 104 serves as a conduction channel 112 between the source 108 and drain 110. The Fin 104 is surrounded by a "wrap-around" gate 114. The wrap-around structure of the gate 114 provides better electrostatic control over the channel 112, and thus helps reduce the leakage current and overcoming other SCEs.

Although a FinFET, such as the FinFET 100, reduces leakage current and avoids or mitigates SCEs compared to planar transistors, ICs employing FinFETs continue to need increased performance. One way to achieve increased performance in a FET, including the FinFET 100, is to apply stress to the channel so as to alter carrier mobility within the channel. For example, stress 116 applied to the channel 112 of the FinFET 100 employed as an N-type FinFET causes corresponding electrons to flow more easily. Further, stress 116 applied to the channel 112 of the FinFET 100 employed as a P-type FinFET causes corresponding holes to flow more easily. In either case, stress 116 applied to the channel 112 is designed to change the carrier mobility so as to increase conductance in the channel 112, thus increasing performance of the corresponding FinFET 100. The stress 116 is achieved by applying compressive or tensile pressure on the channel 112. Conventional methods to apply the stress 116 are more complex and less effective when employed with FinFETs, including the FinFET 100. For example, the stress 116 can be applied to the channel 112 by growing epitaxial layers (not shown) corresponding to the source 108 and drain 110, or by altering the composition of isolation trenches (not shown) separating the FinFET 100 from other devices. Further, these conventional methods are particularly less effective as FinFETs continue to decrease in area.

SUMMARY OF THE DISCLOSURE

Aspects disclosed herein include Fin Field Effect transistors (FETs) (FinFETs) employing dielectric material layers to apply stress to channel regions. In one aspect, a FinFET is provided. The FinFET includes a substrate and a Fin disposed over the substrate. The Fin includes a source, a drain, and a channel region between the source and drain. A gate is disposed around the channel region. To apply stress to the channel region of the FinFET, a first dielectric material layer is disposed over the substrate and adjacent to one side of the Fin. Additionally, a second dielectric material layer is disposed over the substrate and adjacent to another side of the Fin. In this manner, the first and second dielectric material layers both apply stress along the Fin, including to the channel region. Further, unlike stress induced by growing epitaxial layers, the level of stress that may be applied by the first and second dielectric material layers is not dependent on the volume of each layer. Thus, the first and second dielectric material layers may provide a consistent level of stress on the channel region even as the FinFET area decreases.

In this regard in one aspect, a FinFET is provided. The FinFET includes a substrate. The FinFET also includes a Fin disposed over the substrate. The Fin includes a source, a drain, and a channel region disposed between the source and the drain. The FinFET also includes a gate disposed around the channel region. The FinFET also includes a first dielectric material layer disposed over the substrate and adjacent to a first side of the Fin. The first dielectric material layer applies stress to the channel region. The FinFET also includes a second dielectric material layer disposed over the substrate and adjacent to a second side of the Fin different from the first side. The second dielectric material layer applies stress to the channel region.

In another aspect, a FinFET is provided. The FinFET includes a means for providing a substrate. The FinFET also includes a means for providing a Fin over the substrate. The Fin includes a source, a drain, and a channel region disposed between the source and the drain. The FinFET also includes a means for providing a gate around the channel region. The FinFET also includes a means for providing a first dielectric material layer disposed over the substrate and adjacent to a first side of the Fin. The first dielectric material layer applies stress to the channel region. The FinFET also includes a means for providing a second dielectric material layer disposed over the substrate and adjacent to a second side of the Fin different from the first side. The second dielectric material layer applies stress to the channel region.

In another aspect, a method for fabricating a FinFET employing dielectric material layers for applying stress on a channel region is provided. The method includes providing a substrate comprising a Fin. The method also includes disposing a first dielectric material layer over the substrate and adjacent to a first side of the Fin. The method also includes disposing a second dielectric material layer over the substrate and adjacent to a second side of the Fin, wherein the second side is different from the first side. The method also includes disposing a gate with a width approximately equal to a gate length of the FinFET in a gate region over the Fin, the first dielectric material layer, and the second dielectric material layer.

DETAILED DESCRIPTION

Figure 1:
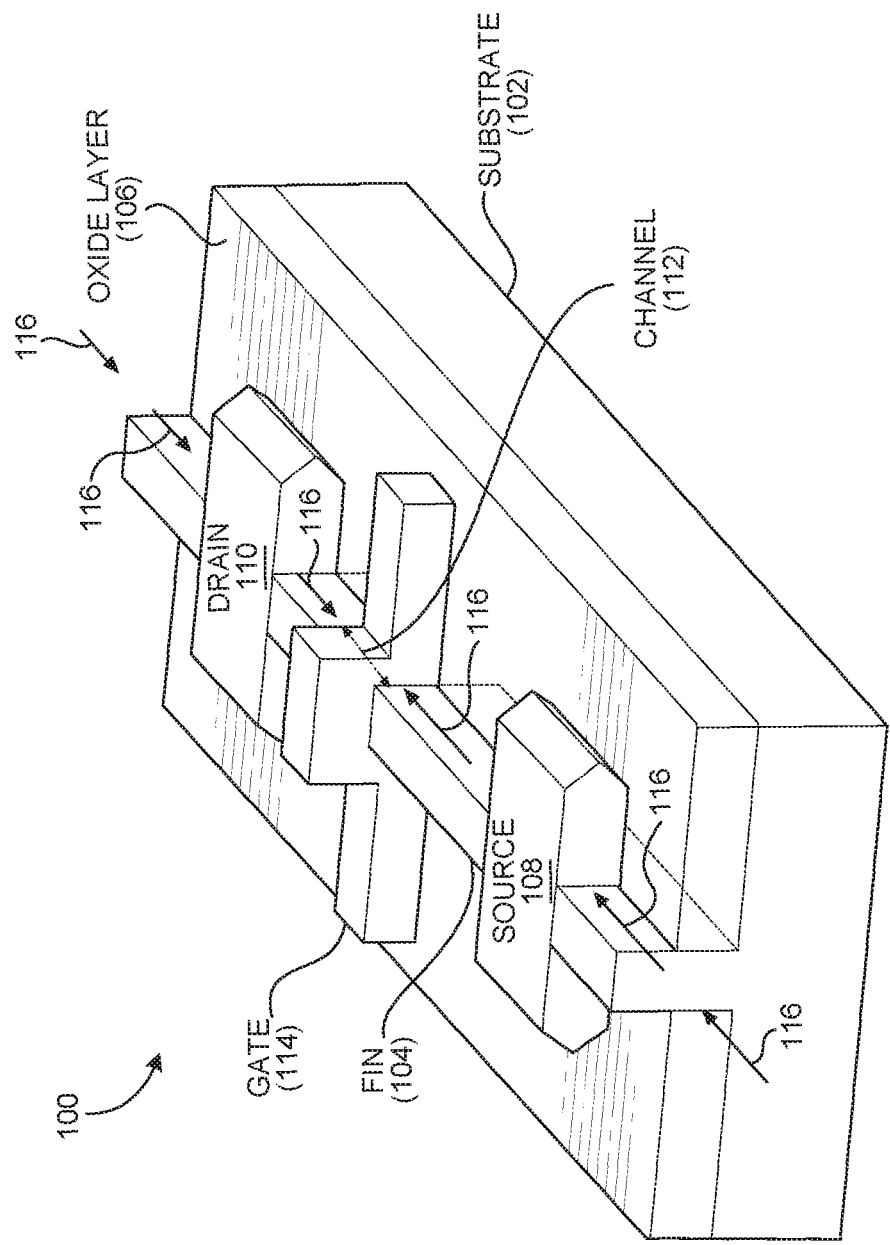
FIG. 1 is a perspective diagram of an exemplary Fin Field Effect transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include Fin Field Effect transistors (FETs) (FinFETs) employing dielectric material layers to apply stress to channel regions. In one aspect, a FinFET is provided. The FinFET includes a substrate and a Fin disposed over the substrate. The Fin includes a source, a drain, and a channel region between the source and drain. A gate is disposed around the channel region. To apply stress to the channel region of the FinFET, a first dielectric material layer is disposed over the substrate and adjacent to one side of the Fin. Additionally, a second dielectric material layer is disposed over the substrate and adjacent to another side of the Fin. In this manner, the first and second dielectric material layers both apply stress along the Fin, including to the channel region. Further, unlike stress induced by growing epitaxial layers, the level of stress that may be applied by the first and second dielectric material layers is not dependent on the volume of each layer. Thus, the first and second dielectric material layers may provide a consistent level of stress on the channel region even as the FinFET area decreases.

Figure 2A:
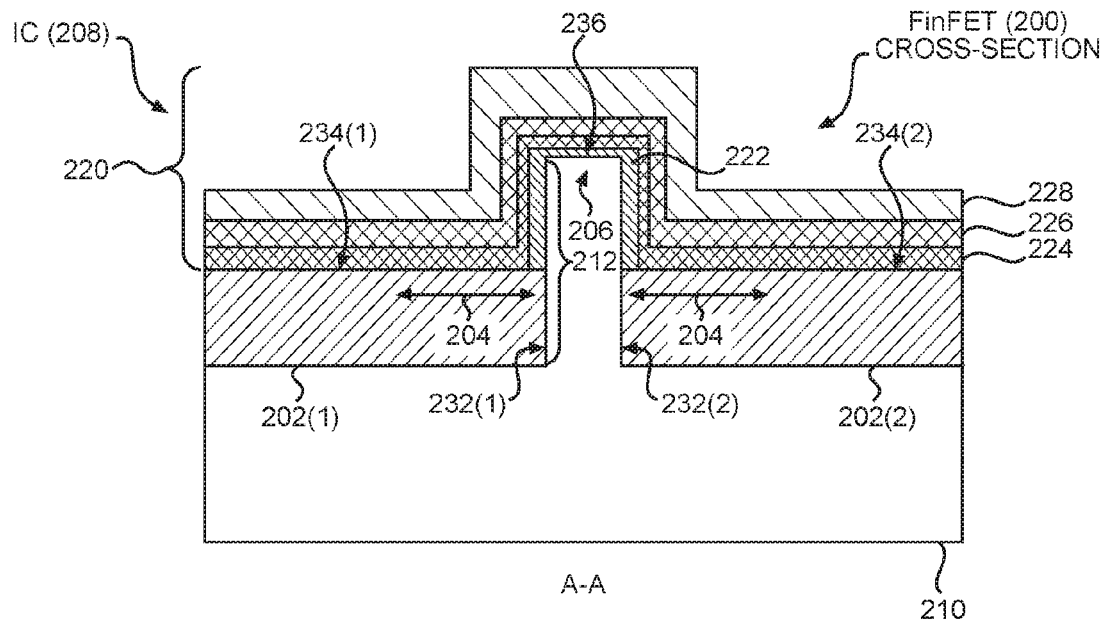
FIG. 2A is a cross-sectional diagram of an exemplary FinFET employing dielectric material layers to apply stress on a channel region.
Figure 2B:
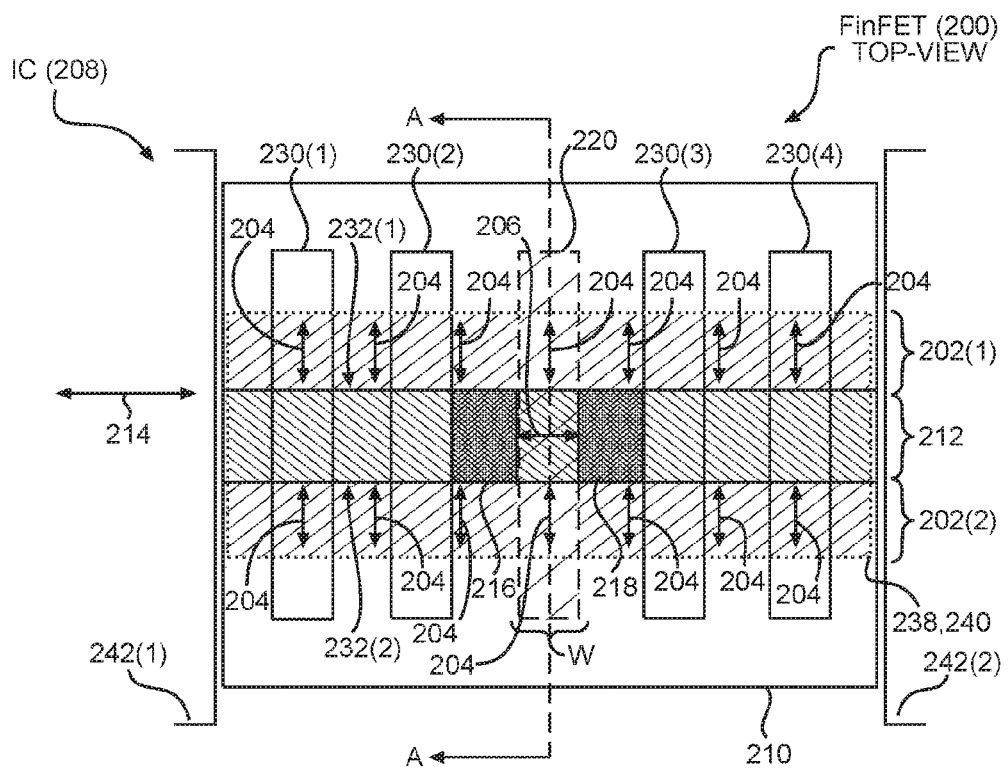
FIG. 2B is a top-view diagram of the exemplary FinFET in FIG. 2A.

In this regard, FIGS. 2A and 2B illustrate an exemplary FinFET 200 employing first and second dielectric material layers 202(1), 202(2) to apply stress 204 to a channel region 206. The FinFET 200 as described herein is designed such that it can be integrated into an integrated circuit (IC) 208. FIG. 2A illustrates a cross-sectional view of the FinFET 200, while FIG. 2B illustrates a top-view of the FinFET 200. Components of the FinFET 200 are referred to with common element numbers in FIGS. 2A and 2B.

With reference to FIGS. 2A and 2B, the FinFET 200 includes a substrate 210 and a Fin 212 disposed over the substrate 210. In this example, the Fin 212 is disposed in a first direction 214. As illustrated in FIG. 2B, the Fin 212 includes a source 216 and a drain 218. The channel region 206 of the FinFET 200 is disposed in the Fin 212 between the source 216 and drain 218. Additionally, a gate 220 is disposed around the channel region 206. In this example, the gate 220 is formed as a high-dielectric metal gate (HKMG). Thus, as described in more detail below, a gate oxide layer 222, a gate dielectric material layer 224, a work function layer 226, and a conductive layer 228 are employed to form the gate 220. However, other aspects of the FinFET 200 may employ gate types other than the HKMG described herein. Further, the FinFET 200 can also employ gate structures 230(1)-230(4) configured to function as dummy gates.

With continuing reference to FIGS. 2A and 2B, to apply the stress 204 to the channel region 206, the first dielectric material layer 202(1) is disposed over the substrate 210 and adjacent to a first side 232(1) of the Fin 212. Additionally, the second dielectric material layer 202(2) is disposed over the substrate 210 and adjacent to a second side 232(2) of the Fin 212 that is different from the first side 232(1). In this example, the first and second dielectric material layers 202(1), 202(2) are disposed in the first direction 214. Additionally, top surfaces 234(1), 234(2) of the first and second dielectric material layers 202(1), 202(2), respectively, are lower than a top surface 236 of the Fin 212 so as to leave space to form the gate 220. Additionally, the first and second dielectric material layers 202(1), 202(2) are disposed within an active area boundary 238 that surrounds an active layer 240 of the FinFET 200. As used herein, the active layer 240 of the FinFET 200 corresponds to doped regions of the substrate 210 on which active elements, such as sources and drains of the FinFET 200 may be formed. In this manner, the first and second dielectric material layers 202(1), 202(2) can be limited to the active area boundary 238 so as to apply the stress 204 to the channel region 206 while avoiding disposing material to inactive or non-doped regions where the stress 204 is not applicable.

With continuing reference to FIGS. 2A and 2B, as described in more detail below, the first and second dielectric material layers 202(1), 202(2) in this aspect are formed from one or more oxide materials disposed (e.g., deposited) over the substrate 210 using a process such as flowable chemical vapor deposition (FCVP) or high aspect ratio processing (HARP). The oxide material(s) of the first and second dielectric material layers 202(1), 202(2) may be thermally annealed to apply a particular type or magnitude of the stress 204. For example, the first and second dielectric material layers 202(1), 202(2) can be formed from silicon dioxide or silicon nitride. If the FinFET 200 is an N-type FinFET, the first and second dielectric material layers 202(1), 202(2) can be thermally annealed such that the stress 204 applied to the channel region 206 is tensile stress. Conversely, if the FinFET 200 is a P-type FinFET, the first and second dielectric material layers 202(1), 202(2) can be thermally annealed such that the stress 204 applied to the channel region 206 is compressive stress.

With continuing reference to FIGS. 2A and 2B, disposing and annealing the oxide material(s) of the first and second dielectric material layers 202(1), 202(2) as described above applies the stress 204 along the Fin 212, including the channel region 206. In this manner, unlike stress induced by other methods, such as by growing epitaxial layers, the level of the stress 204 applied by the first and second dielectric material layers 202(1), 202(2) is not dependent on the volume of the first and second dielectric material layers 202(1), 202(2). More specifically, in an exemplary FinFET employing epitaxial layers instead of the first and second dielectric material layers 202(1), 202(2), the magnitude of the stress applied by the epitaxial layers correlates to the volume of such layers. Thus, as the area of such a FinFET decreases, so too does the magnitude of the stress induced by the epitaxial layers. This is due, in part, to the property of the crystalline structure of the epitaxial layers inducing less stress as the volume of the crystalline structure is reduced. Thus, unlike the stress induced by epitaxial layers, the first and second dielectric material layers 202(1), 202(2) may provide a consistent level of stress 204 on the channel region 206 even as the area of the FinFET 200 decreases.

Further, unlike stress induced by using shallow trench isolation (STI) structures 242(1), 242(2) employed to electrically isolate the FinFET 200 from other devices in a circuit, applying the stress 204 using the first and second dielectric material layers 202(1), 202(2) does not increase area of the FinFET 200. For example, the STI structures 242(1), 242(2) can be designed to induce stress by increasing a width of each STI structure 242(1), 242(2). An increased width of the STI structures 242(1), 242(2) increases the area of the circuit employing the FinFET 200. Additionally, an increased width of the STI structures 242(1), 242(2) reduces the magnitude of stress applied to the FinFET 200. More specifically, the magnitude of the stress applied by the STI structures 242(1), 242(2) is inversely proportional to the width of the STI structures 242(1), 242(2). Thus, as the STI structures 242(1), 242(2) expand, the resulting applied stress is reduced. Therefore, in addition to providing consistent stress 204 even as the area of the FinFET 200 decreases, the first and second dielectric material layers 202(1), 202(2) apply the stress 204 at a consistent magnitude without increasing area.

Figure 3A:
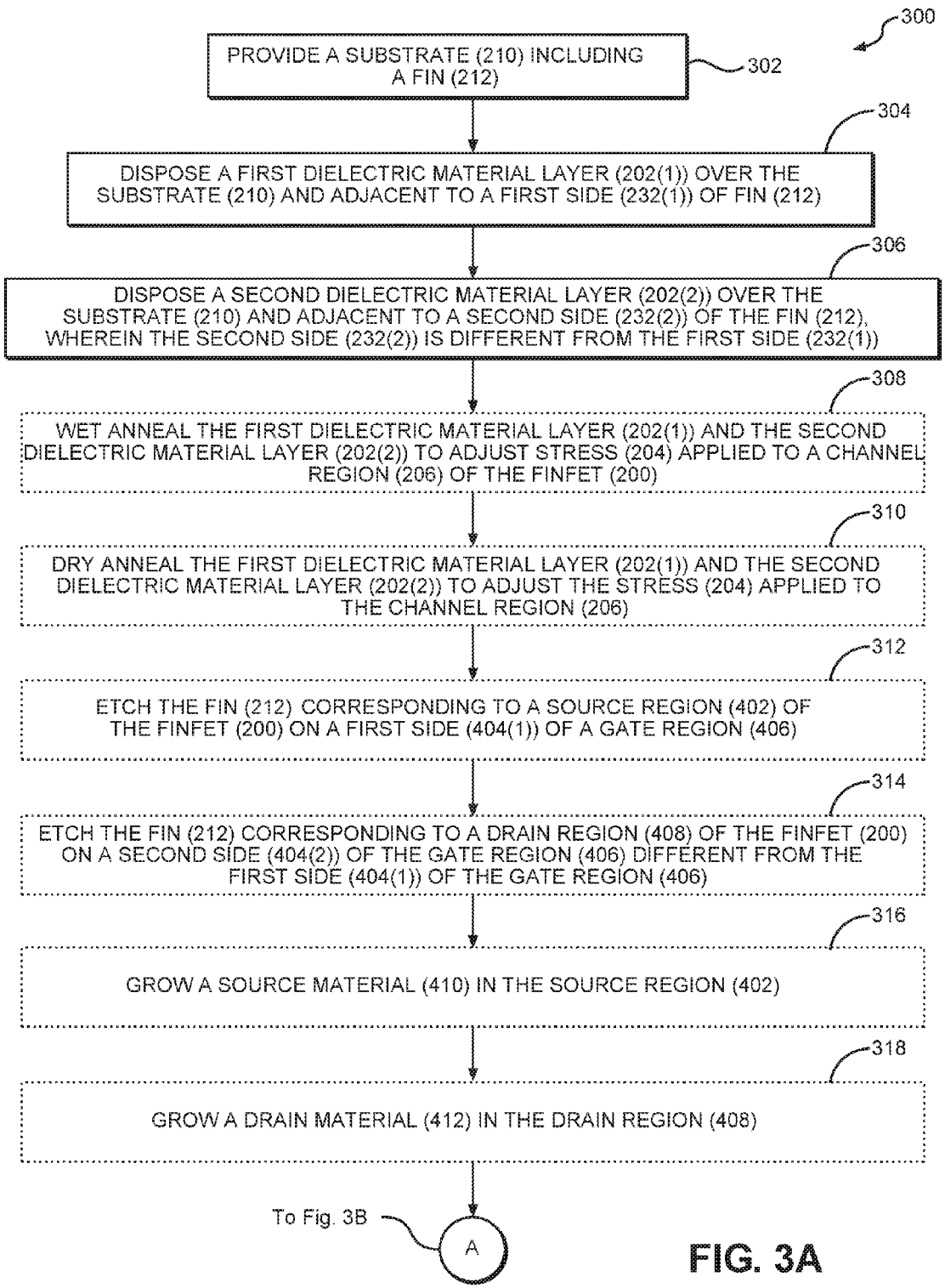
FIGS. 3A, 3B provide a flowchart illustrating an exemplary process of fabricating the FinFET employing dielectric material layers for applying stress to the channel region in FIGS. 2A, 2B.
Figure 3B:
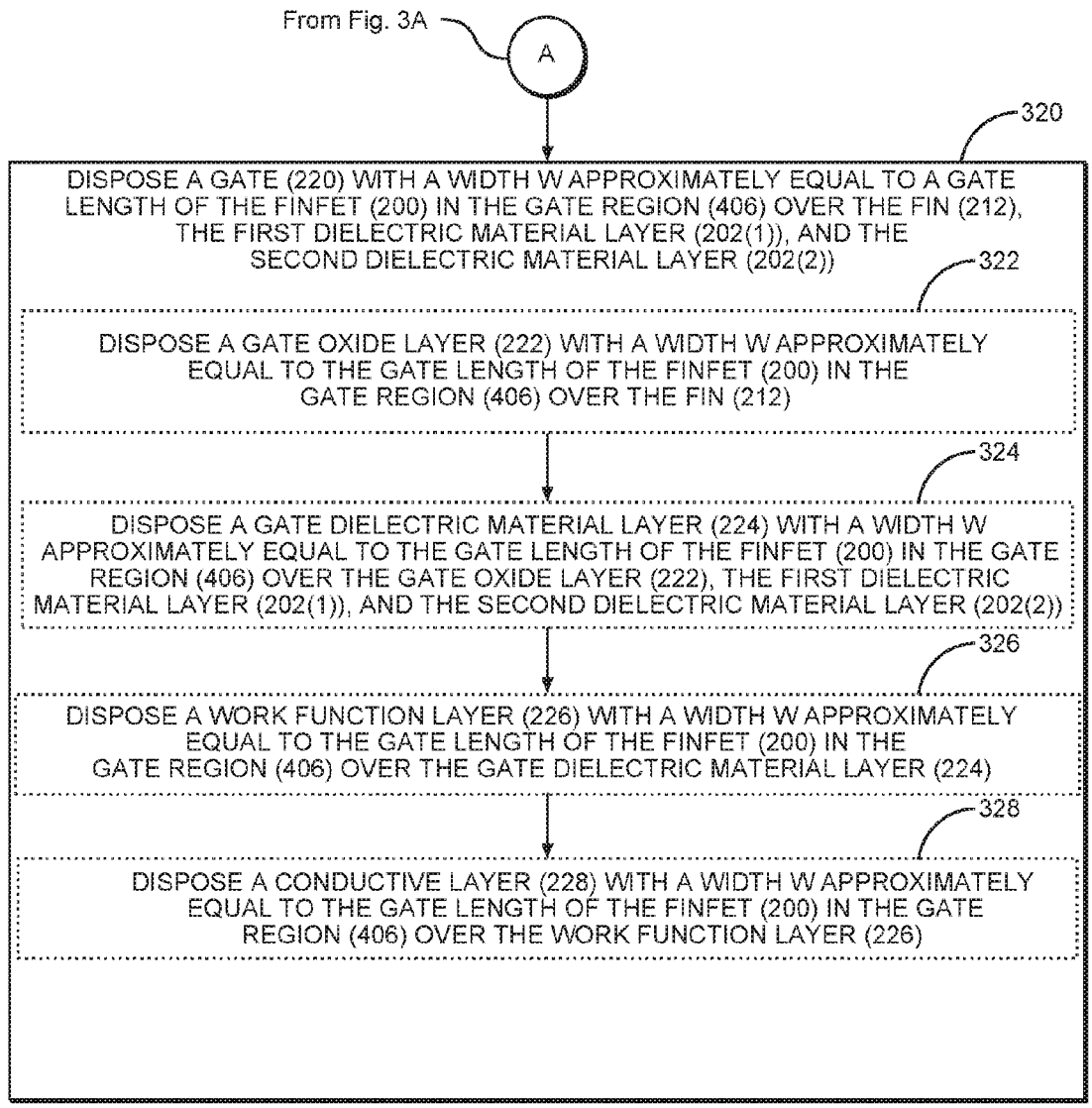

FIGS. 3A and 3B illustrate an exemplary fabrication process 300 employed to fabricate the FinFET 200 in FIGS. 2A and 2B. Further, FIGS. 4A-4D provide cross-sectional and top view diagrams illustrating respective stages 400(1)-400(4) of the FinFET 200 during the fabrication process 300. The cross-sectional and top-view diagrams illustrating the FinFET 200 in FIGS. 4A-4D will be discussed in conjunction with the discussion of the exemplary fabrication steps in the fabrication process 300 in FIGS. 3A and 3B.

Figure 4A:
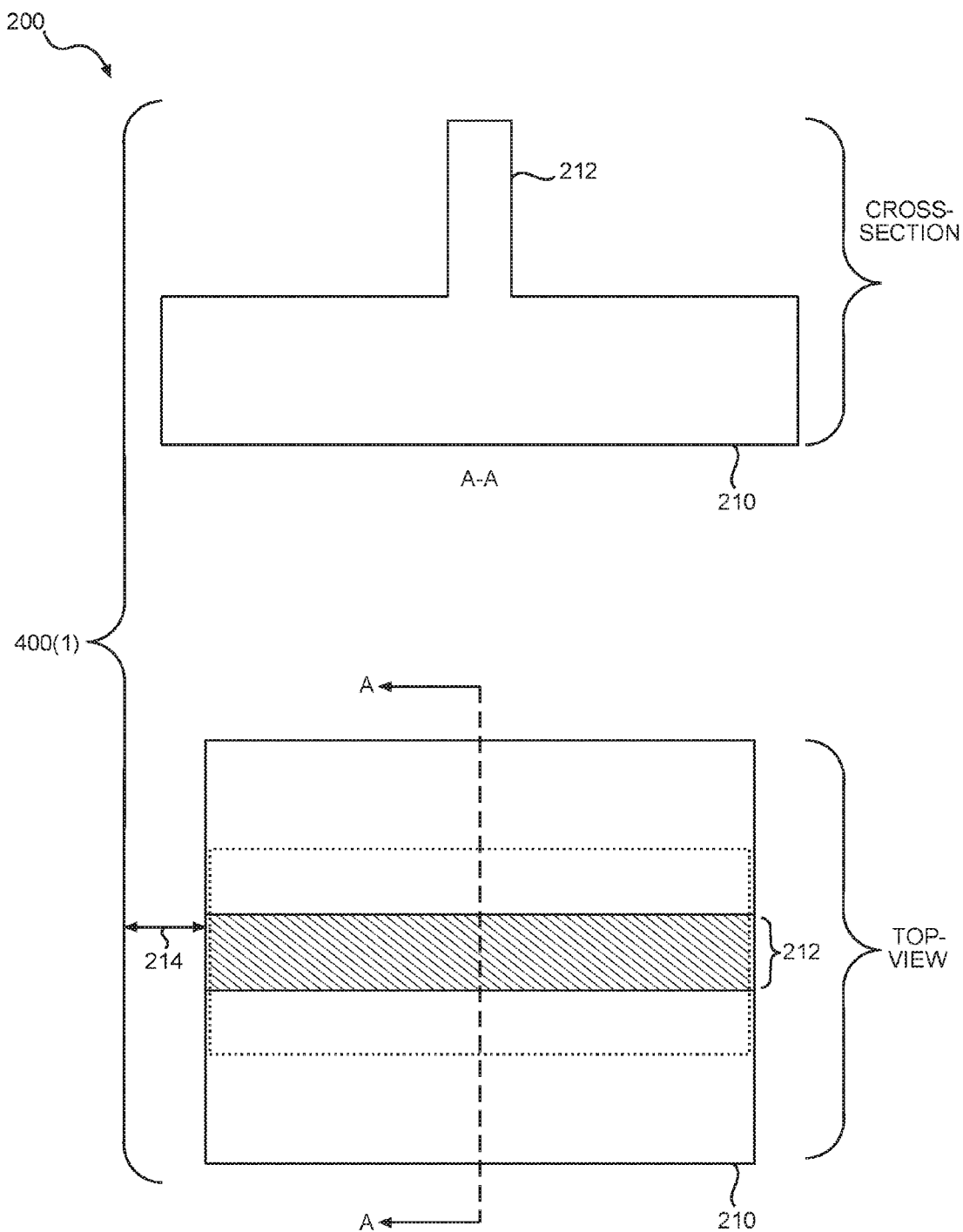
FIGS. 4A-4D are cross-sectional and top-view diagrams illustrating the FinFET in FIG. 2B at each stage in the process of fabrication of FIG. 3.

In this regard, the fabrication process 300 beginning in FIG. 3A includes providing the substrate 210 including the Fin 212 (block 302, stage 400(1) of FIG. 4A). In this example, the Fin 212 is disposed in the first direction 214. The fabrication process 300 also includes disposing the first dielectric material layer 202(1) over the substrate 210 and adjacent to the first side 232(1) of the Fin 212 (block 304, stage 400(2) of FIG. 4B). The fabrication process 300 further includes disposing the second dielectric material layer 202(2) over the substrate 210 and adjacent to the second side 232(2) of the Fin 212 (block 306, stage 400(2) of FIG. 4B). In this example, the first and second dielectric material layers 202(1), 202(2) are disposed in the first direction 214. As previously described, the first and second dielectric material layers 202(1), 202(2) can be disposed over the substrate 210 in blocks 304 and 306 using processes such as flowable chemical vapor deposition (FCVP) or high aspect ratio processing (HARP). Further, the first and second dielectric material layers 202(1), 202(2) can be disposed to be limited to the active area boundary 238.

With continuing reference to FIGS. 3A and 3B, thermal annealing can be employed to adjust the stress 204 applied by the first and second dielectric material layers 202(1), 202(2). More specifically, the fabrication process 300 can include wet annealing the first dielectric material layer 202(1) and the second dielectric material layer 202(2) to adjust the stress 204 applied to the channel region 206 of the FinFET 200 (block 308, stage 400(2) of FIG. 4B). For example, a low temperature wet anneal process of approximately 600 degrees Celcius (C) may be employed in block 308. The fabrication process 300 can also include dry annealing the first dielectric material layer 202(1) and the second dielectric material layer 202(2) to adjust the stress 204 applied to the channel region 206 of the FinFET 200 (block 310, stage 400(2) of FIG. 4B). For example, a high temperature annealing process of approximately 1050 C can be employed in block 310.

Figure 4B:
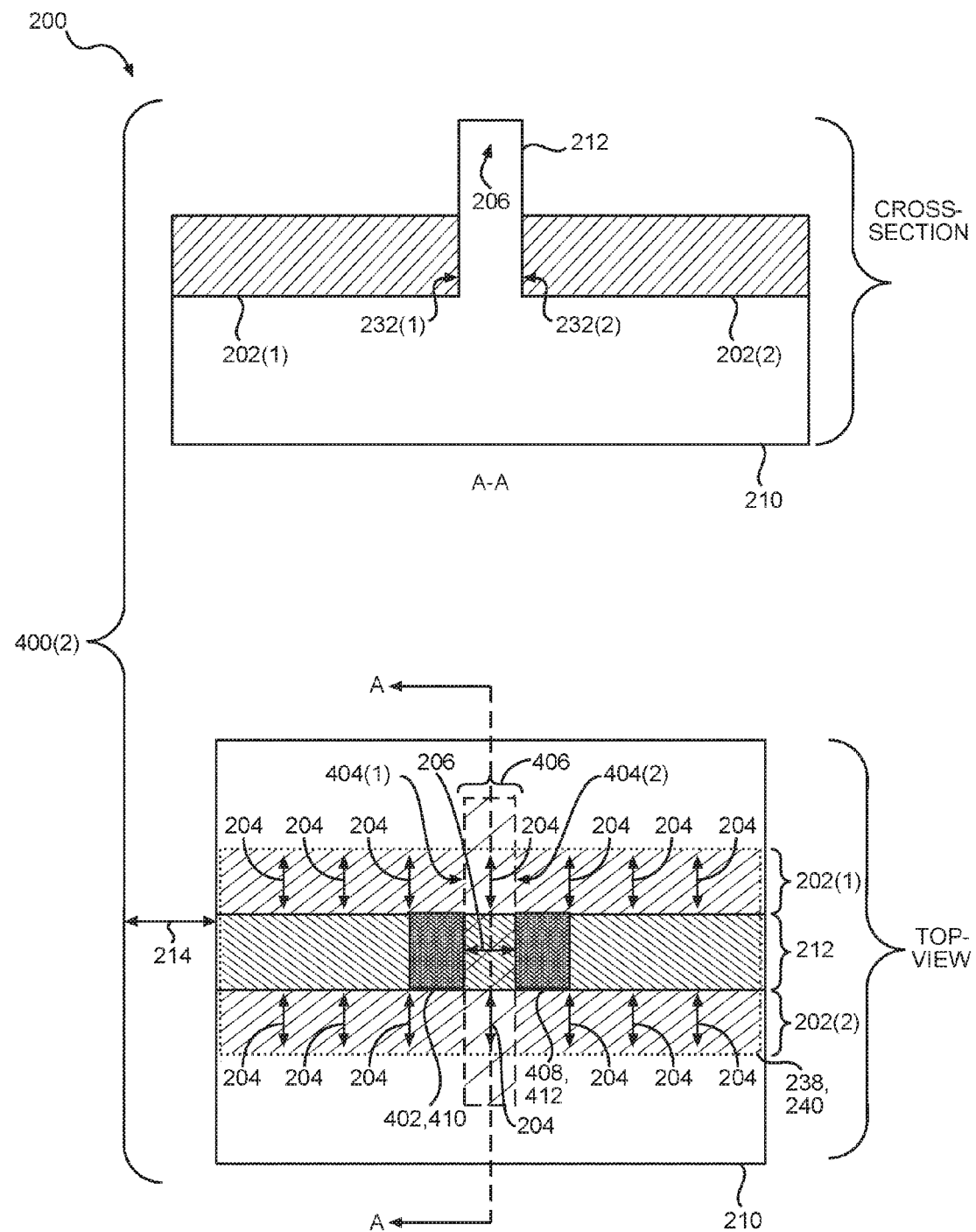

With continuing reference to FIGS. 3A and 3B, the fabrication process 300 can include etching the Fin 212 corresponding to a source region 402 of the FinFET 200 on a first side 404(1) of a gate region 406 (block 312, stage 400(2) of FIG. 4B). The fabrication process 300 can also include etching the Fin 212 corresponding to a drain region 408 of the FinFET 200 on a second side 404(2) of the gate region 406 different from the first side 404(1) (block 314, stage 400(2) of FIG. 4B). Further, the fabrication process 300 can include growing a source material 410 in the source region 402 (block 316, stage 400(2) of FIG. 4B). The fabrication process 300 can also include growing a drain material 412 in the drain region 408 (block 318, stage 400(2) of FIG. 4B).

Figure 4C:
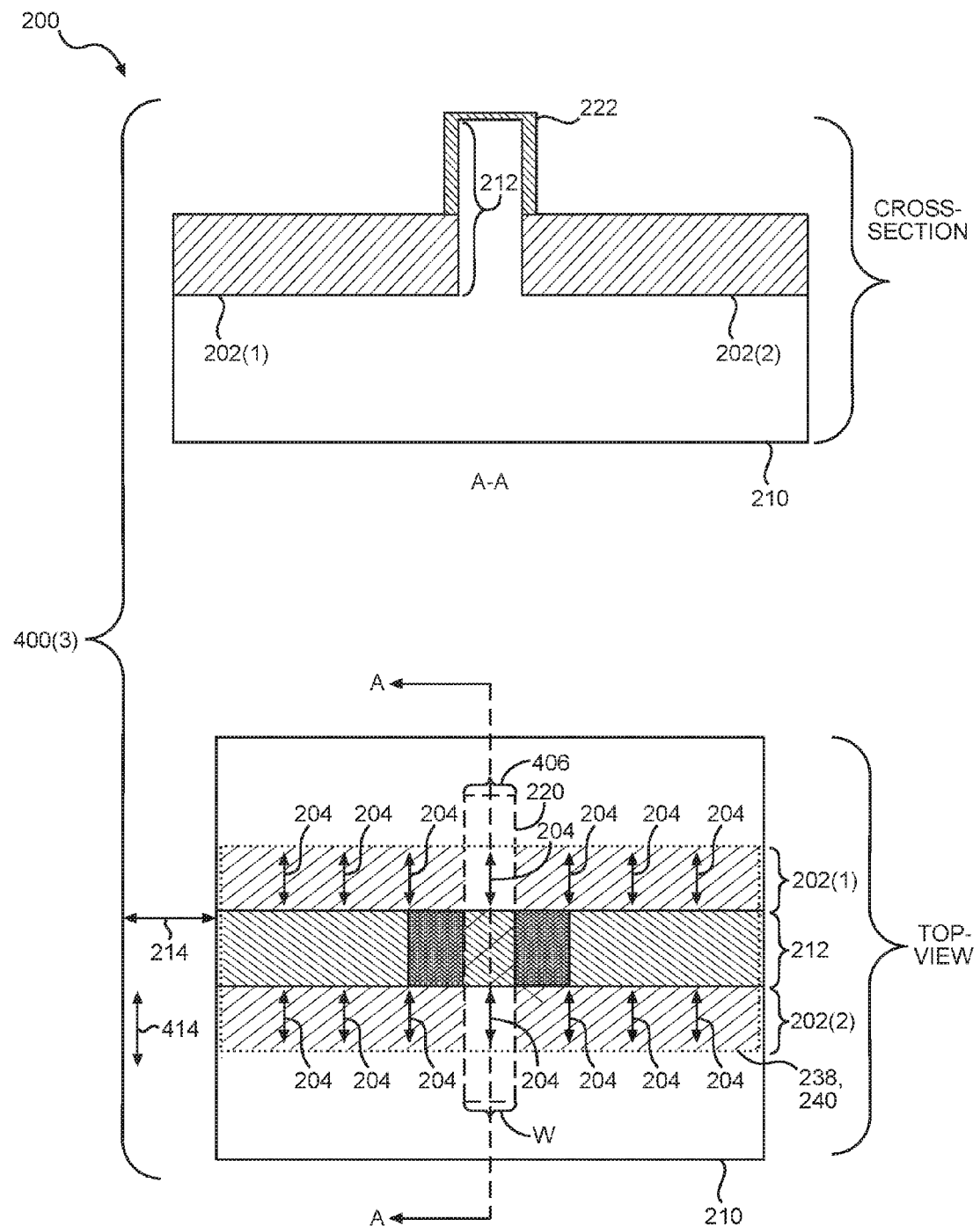
Figure 4D:
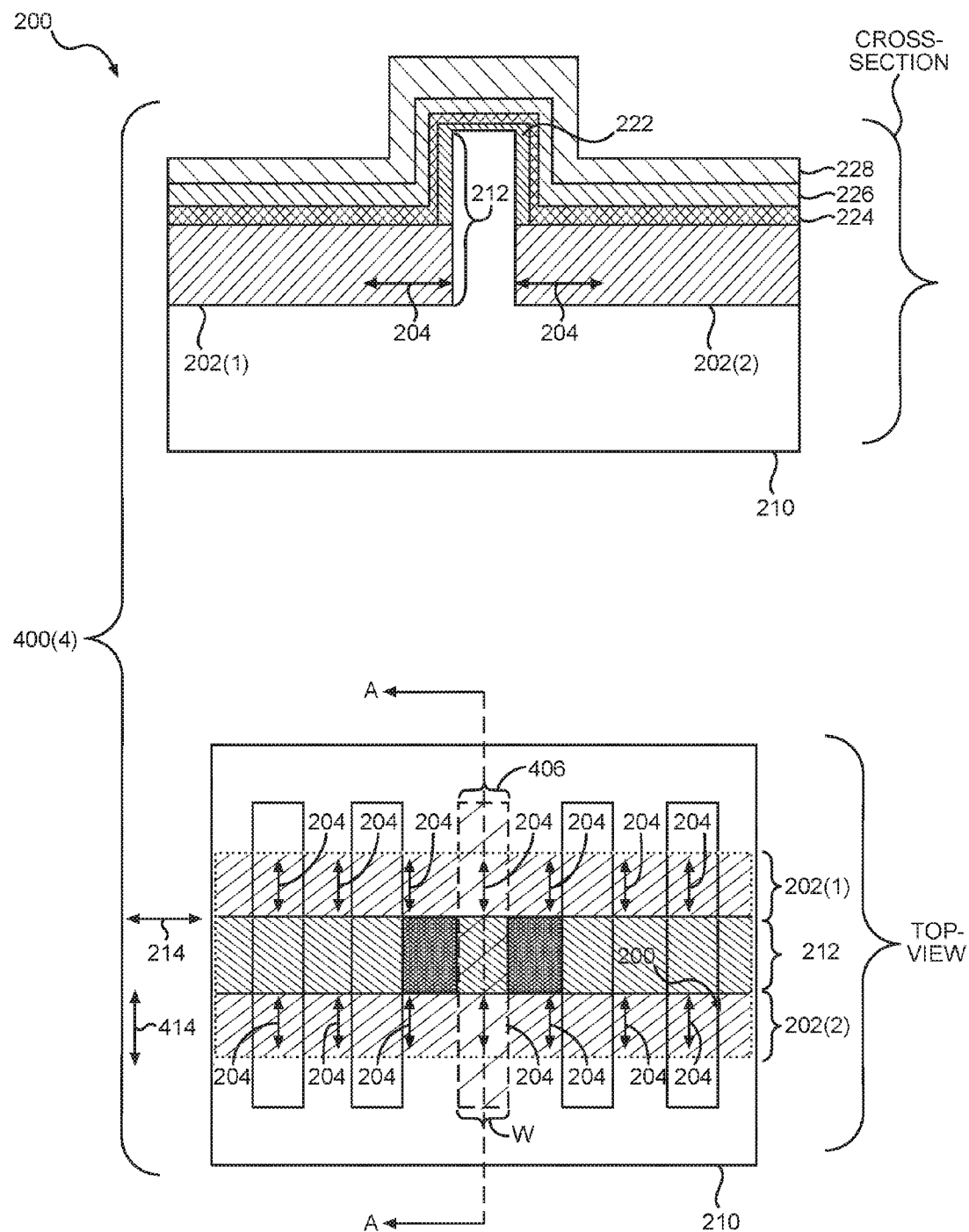

With continuing reference to FIGS. 3A and 3B, the fabrication process 300 also includes disposing the gate 220 with a width W approximately equal to a gate length of the FinFET 200 in the gate region 406 (block 320, stages 400(3), 400(4) in FIGS. 4C, 4D). For example, if the FinFET 200 is employed in ten (10) nanometer (nm) technology, then the gate length is approximately equal to 10 nm. In particular, the gate 220 is disposed over the Fin 212, the first dielectric material layer 202(1), and the second dielectric material layer 202(2). In this example, the gate 220 is disposed in a second direction 414 substantially orthogonal to the first direction 214. The gate 220 can be disposed in block 320 by disposing the gate oxide layer 222 with a width W approximately equal to the gate length of the FinFET 200 in the gate region 406 over the Fin 212 (block 322, stage 400(3) of FIG. 4C). Disposing the gate 220 in block 320 can also include disposing the gate dielectric material layer 224 with the width W approximately equal to the gate length of the FinFET 200 in the gate region 406 (block 324, stage 400(4) of FIG. 4D). The gate dielectric material layer 224 is disposed in block 324 over the gate oxide layer 222, the first dielectric material layer 202(1), and the second dielectric material layer 202(2). Disposing the gate 220 in block 320 can also include disposing the work function layer 226 with the width W approximately equal to the gate length of the FinFET 200 in the gate region 406 (block 326, stage 400(4) of FIG. 4D). The work function layer 226 is disposed over the gate dielectric material layer 224. Further, disposing the gate 220 in block 320 can include disposing the conductive layer 228 with the width W approximately equal to the gate length of the FinFET 200 in the gate region 406 over the work function layer 226 (block 328, stage 400(4) of FIG. 4D).

Manufacturing the FinFET 200 using the fabrication process 300 enables the FinFET 200 to provide a consistent level of stress 204 to the channel region 206 even as the area of the FinFET 200 decreases. Additionally, the fabrication process 300 includes various steps included in conventional FinFET fabrication methods. Integrating additional steps above for inducing a particular type or magnitude of the stress 204 may include one (1) additional mask as compared to conventional methods. Thus, the FinFET 200 can be fabricated to apply the stress 204 as described above while minimizing increased manufacturing costs and complexity.

Figure 5A:
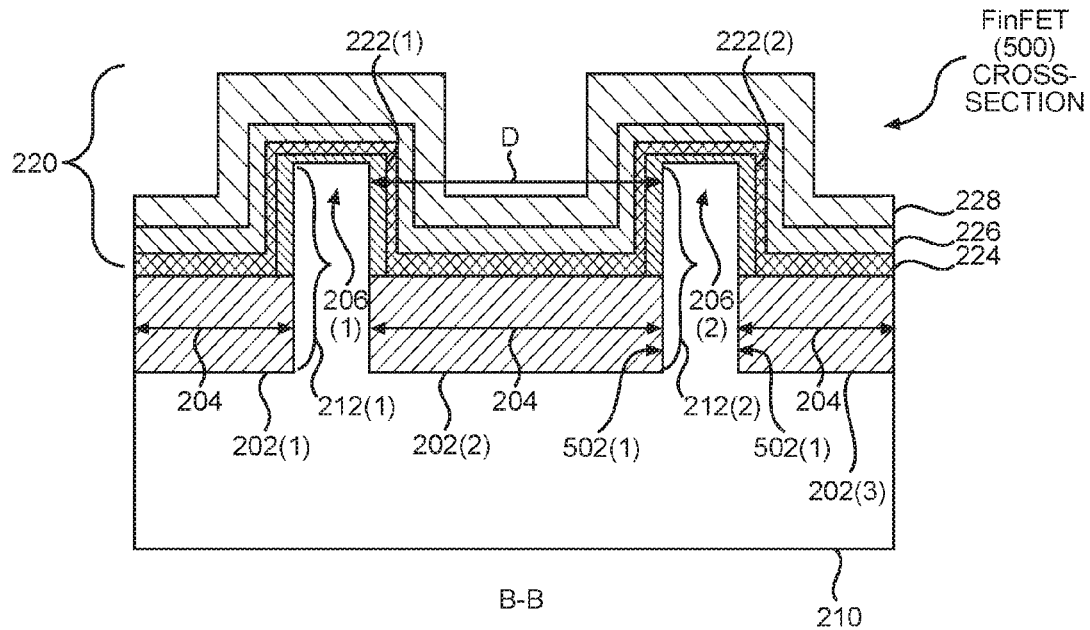
FIG. 5A is a cross-sectional diagram of an exemplary FinFET employing dielectric material layers corresponding to multiple Fins to apply stress to multiple channel regions.
Figure 5B:
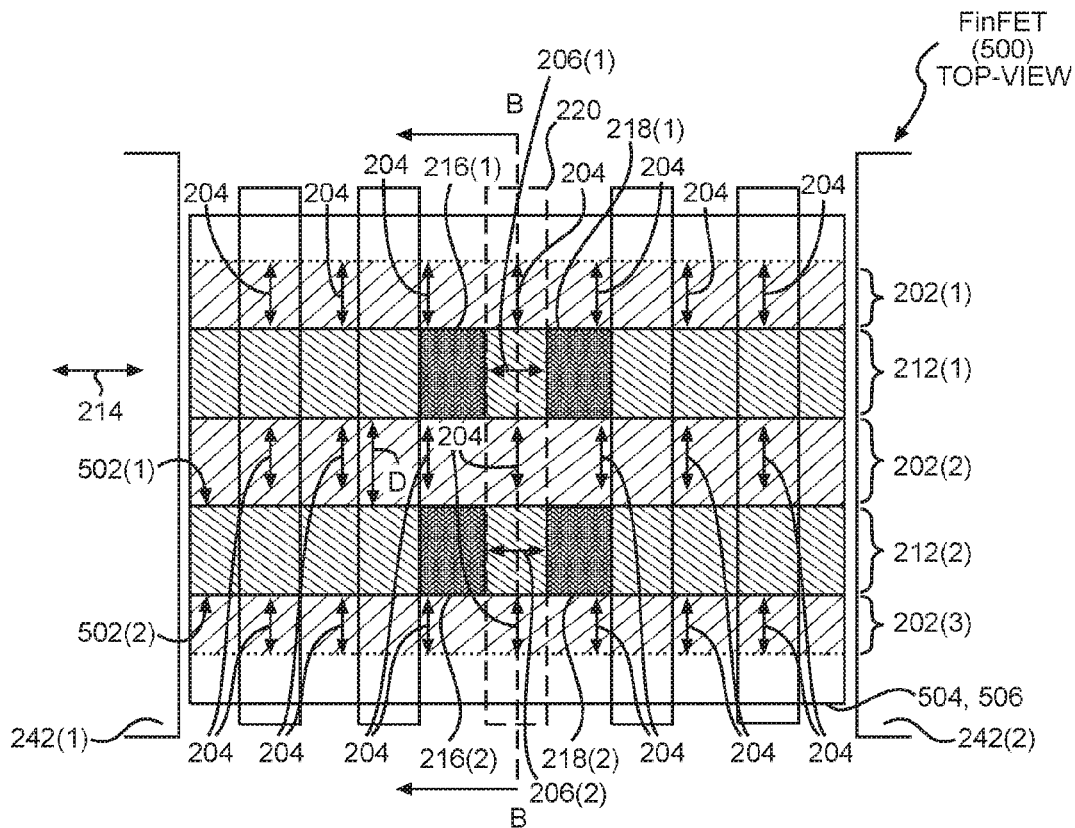
FIG. 5B is a top-view diagram of the exemplary FinFET with multiple Fins in FIG. 5A.

In addition to the FinFET 200 in FIGS. 2A and 2B, aspects described herein can also include FinFETs employing dielectric material layers corresponding to multiple Fins to apply stress to multiple channel regions. In this regard, FIGS. 5A and 5B illustrate an exemplary FinFET 500 employing first, second, and third dielectric material layers 202(1)-202(3) to apply the stress 204 on first and second channel regions 206(1), 206(2). FIG. 5A illustrates a cross-sectional view of the FinFET 500, while FIG. 5B illustrates a top-view of the FinFET 500. Components of the FinFET 500 are referred to with common element numbers in FIGS. 5A and 5B. Further, the FinFET 500 includes certain common components with the FinFET 200 in FIGS. 2A, 2B, as shown by similar element numbers between FIGS. 2A, 2B, 5A, and 5B, and thus will not be re-described herein.

With continuing reference to FIGS. 5A and 5B, the FinFET 500 includes the substrate 210 and first and second Fins 212(1), 212(2) disposed 214 over the substrate 210. In this example, the first and second Fins 212(1), 212(2) are disposed in the first direction 214. As a non-limiting example, if the FinFET 500 is fabricated in a 10 nm technology (i.e., a 10 nm gate length), the first and second Fins 212(1), 212(2) are separated by a distance D approximately equal to 32 nm. As illustrated in FIG. 5B, the first and second Fins 212(1), 212(2) each include a source 216(1), 216(2) and a drain 218(1), 218(2), respectively. First and second channel regions 206(1), 206(2) of the FinFET 500 are disposed in the first and second Fins 212(1), 212(2), respectively, between the respective source 216(1), 216(2) and drain 218(1), 218(2). Additionally, the gate 220 is disposed around the first and second channel regions 206(1), 206(2). Similar to the FinFET 200, gate oxide layers 222(1), 222(2) over the first and second Fins 212(1), 212(2), respectively, the gate dielectric material layer 224, the work function layer 226, and the conductive layer 228 are employed to form the gate 220.

With continuing reference to FIGS. 5A and 5B, in addition to the first and second dielectric material layers 202(1), 202(2) applying the stress 204 to the first channel region 206(1), the FinFET 500 is designed such that the stress 204 is also applied to the channel region 206(2). In particular, to apply the stress 204 to the channel region 206(2) of the second Fin 212(2), a third dielectric material layer 202(3) is disposed over the substrate 210 and adjacent to a second side 502(2) of the second Fin 212(2). Additionally, the second dielectric material layer 202(2) is disposed over the substrate 210 and adjacent to a first side 502(1) of the second Fin 212(2) that is different from the second side 502(2). In this example, the second and third dielectric material layers 202(2), 202(3) are disposed in the first direction 214. In this matter, the second dielectric material layer 202(2) also applies the stress 204 to the channel region 206(2). Additionally, the first, second, and third dielectric material layers 202(1)-202(3) are disposed within an active area boundary 504 that surrounds an active layer 506 of the FinFET 500. Thus, the first, second, and third dielectric material layers 202(1)-202(3) may provide a consistent level of stress 204 on the first and second channel regions 206(1), 206(2) even as the area of the FinFET 500 decreases. For example, as the area of the FinFET 500 decreases, the distance D between the first and second Fins 212(1), 212(2) also decreases below 32 nm. However, due to the properties of the first, second, and third dielectric material layers 202(1)-202(3) described above, the stress 204 remains consistent even as the distance D decreases, unlike stress induced by epitaxial layers.

The elements described herein are sometimes referred to as means for achieving a particular property. In this regard the substrate 210 is sometimes referred to herein as "a means for providing a substrate." The Fin 212 is sometimes referred to herein as "a means for providing a Fin over the substrate." Further, the gate 220 is sometimes referred to herein as "a means for providing a gate around the channel region." The first dielectric material layer 202(1) is sometimes referred to herein as "a means for providing a first dielectric material layer disposed over the substrate and adjacent to a first side of the Fin, wherein the first dielectric material layer applies stress to the channel region." The second dielectric material layer 202(2) is sometimes referred to herein as "a means for providing a second dielectric material layer disposed over the substrate and adjacent to a second side of the Fin different from the first side, wherein the second dielectric material layer applies stress to the channel region."

The FINFETs employing dielectric material layers to apply stress to channel regions according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
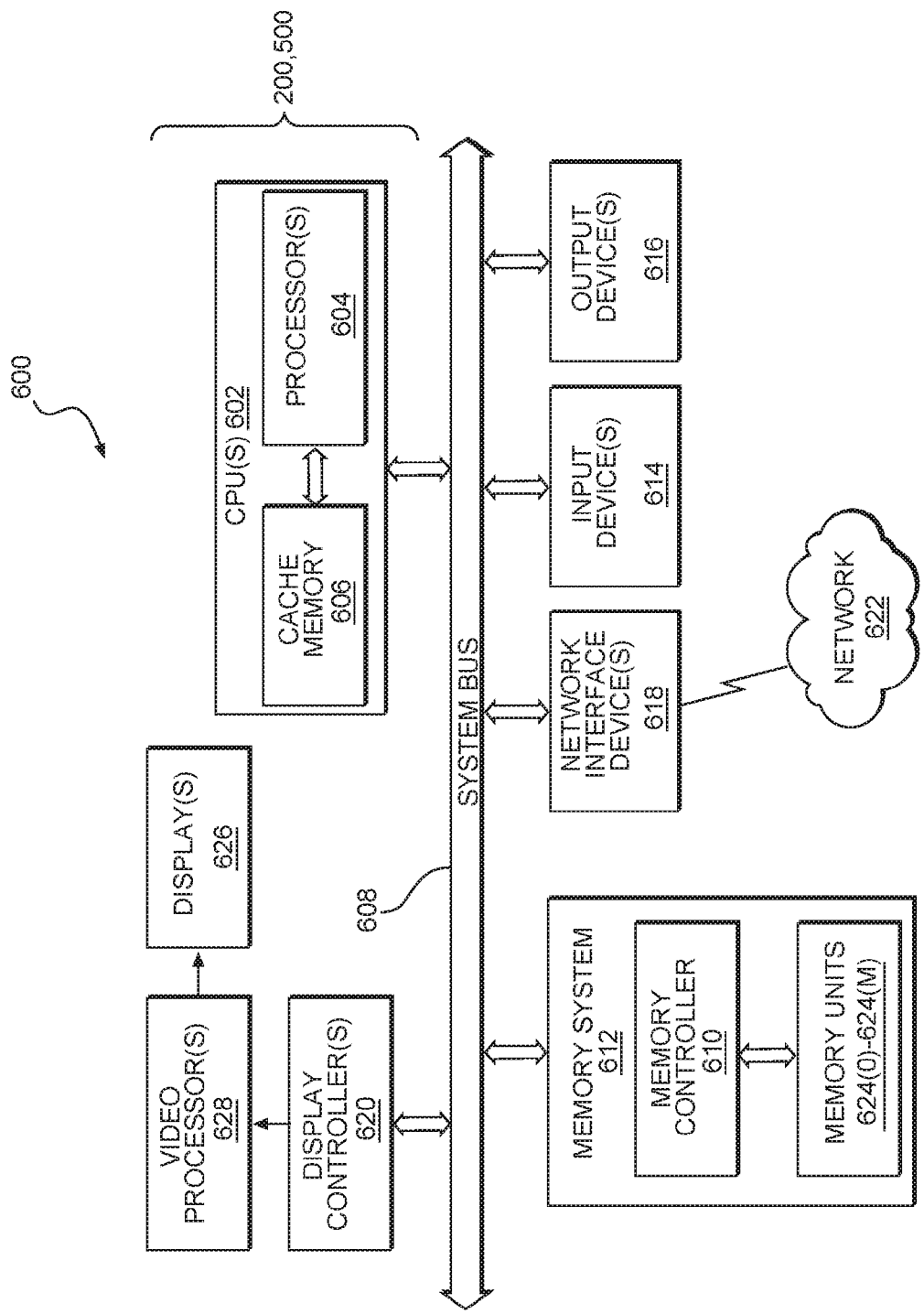
FIG. 6 is a block diagram of an exemplary processor-based system that can include the FinFETs employing dielectric material layers to apply stress on channel regions of FIGS. 2A, 2B, 5A, and 5B.

In this regard, FIG. 6 illustrates an example of a processor-based system 600 that can employ the FinFET 200 illustrated in FIGS. 2A and 2B, and the FinFET 500 illustrated in FIGS. 5A and 5B. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any device configured to allow exchange of data to and from a network 622. The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(0)-624(M).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A Fin Field Effect transistor (FET) (FinFET), comprising:
   a substrate;
   a Fin disposed over the substrate, the Fin comprising:
   a source;
   a drain; and
   a channel region disposed between the source and the drain;
   a gate disposed around the channel region;

a first dielectric material layer disposed over the substrate and adjacent to a first side of the Fin, wherein the first dielectric material layer applies stress to the channel region; and a second dielectric material layer disposed over the substrate and adjacent to a second side of the Fin different from the first side, wherein the second dielectric material layer applies stress to the channel region.

2. The FinFET of claim 1, further comprising an active area boundary surrounding an active layer of the FinFET, wherein the first dielectric material layer and the second dielectric material layer are each disposed within the active area boundary.

3. The FinFET of claim 1, wherein:
a top surface of the first dielectric material layer is lower than a top surface of the Fin; and
a top surface of the second dielectric material layer is lower than the top surface of the Fin.

4. The FinFET of claim 1, wherein:
the FinFET comprises an N-type FinFET; and
the first and second dielectric material layers comprise one or more oxide materials such that the first and second dielectric material layers apply tensile stress to the channel region.

5. The FinFET of claim 1, wherein:
the FinFET comprises a P-type FinFET; and
the first and second dielectric material layers comprise one or more oxide materials such that the first and second dielectric material layers apply compressive stress to the channel region.

6. The FinFET of claim 1, further comprising:
a second Fin disposed over the substrate and substantially parallel to the Fin, the second Fin comprising:
a source;
a drain; and
a channel region disposed between the source and the drain of the second Fin;
the gate disposed around the channel region of the second Fin; and
a third dielectric material layer disposed over the substrate and adjacent to a second side of the second Fin, wherein:
the third dielectric material layer applies stress to the channel region of the second Fin; and
the second dielectric material layer is disposed over the substrate and adjacent to a first side of the second Fin different from the second side such that the second dielectric material layer applies stress to the channel region of the second Fin.

7. The FinFET of claim 6, further comprising an active area boundary surrounding an active layer of the FinFET, wherein the first dielectric material layer, the second dielectric material layer, and the third dielectric material layer are each disposed within the active area boundary.

8. The FinFET of claim 7, wherein a distance between the Fin and the second Fin is approximately equal to 32 nanometers (nm).

9. The FinFET of claim 1 integrated into an integrated circuit (IC).

10. The FinFET of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A Fin Field Effect transistor (FET) (FinFET), comprising:
a means for providing a substrate;
a means for providing a Fin over the substrate, the Fin comprising:
a source;
a drain; and
a channel region disposed between the source and the drain;
a means for providing a gate around the channel region;
a means for providing a first dielectric material layer disposed over the substrate and adjacent to a first side of the Fin, wherein the first dielectric material layer applies stress to the channel region; and
a means for providing a second dielectric material layer disposed over the substrate and adjacent to a second side of the Fin different from the first side, wherein the second dielectric material layer applies stress to the channel region.

12. The FinFET of claim 11, further comprising a means for forming an active area boundary surrounding an active layer of the FinFET, wherein the first dielectric material layer and the second dielectric material layer are each disposed within the active area boundary.

13. The FinFET of claim 11, further comprising:
a means for providing a second Fin over the substrate and substantially parallel to the Fin, the second Fin comprising:
a source;
a drain; and
a channel region disposed between the source and the drain of the second Fin;
a means for providing the gate around the channel region of the second Fin; and
a means for providing a third dielectric material layer disposed over the substrate and adjacent to a second side of the second Fin, wherein:
the third dielectric material layer applies stress to the channel region of the second Fin; and
the second dielectric material layer is disposed over the substrate and adjacent to a first side of the second Fin different from the second side such that the second dielectric material layer applies stress to the channel region of the second Fin.

14. The FinFET of claim 13, further comprising a means for forming an active area boundary surrounding an active layer of the FinFET, wherein the first dielectric material layer, the second dielectric material layer, and the third dielectric material layer are each disposed within the active area boundary.

15. A method for fabricating a Fin Field Effect transistor (FET) (FinFET) employing dielectric material layers for applying stress on a channel region, comprising:
providing a substrate comprising a Fin;
disposing a first dielectric material layer over the substrate and adjacent to a first side of the Fin;

disposing a second dielectric material layer over the substrate and adjacent to a second side of the Fin, wherein the second side is different from the first side; and disposing a gate with a width approximately equal to a gate length of the FinFET in a gate region over the Fin, the first dielectric material layer, and the second dielectric material layer.

16. The method of claim 15, wherein:

disposing the first dielectric material layer comprises disposing the first dielectric material layer over the substrate and adjacent to the first side of the Fin within an active area boundary that surrounds an active layer of the FinFET; and disposing the second dielectric material layer comprises disposing the second dielectric material layer over the substrate and adjacent to the second side of the Fin within the active area boundary.

17. The method of claim 15, further comprising wet annealing the first dielectric material layer and the second dielectric material layer to adjust stress applied to a channel region of the FinFET.

18. The method of claim 17, further comprising dry annealing the first dielectric material layer and the second dielectric material layer to adjust stress applied to the channel region of the FinFET.

19. The method of claim 15, wherein disposing the gate comprises:

disposing a gate oxide layer with a width approximately equal to the gate length of the FinFET in the gate region over the Fin;

disposing a gate dielectric material layer with a width approximately equal to the gate length of the FinFET in the gate region over the gate oxide layer, the first dielectric material layer, and the second dielectric material layer;

disposing a work function layer with a width approximately equal to the gate length of the FinFET in the gate region over the gate dielectric material layer; and disposing a conductive layer with a width approximately equal to the gate length of the FinFET in the gate region over the work function layer.

20. The method of claim 15, further comprising:

etching the Fin corresponding to a source region of the FinFET on a first side of the gate region;

etching the Fin corresponding to a drain region of the FinFET on a second side of the gate region different from the first side of the gate region;

growing a source material in the source region; and growing a drain material in the drain region.

21. The method of claim 15, wherein:

disposing the first dielectric material layer comprises disposing the first dielectric material layer over the substrate and adjacent to the first side of the Fin using flowable chemical vapor deposition; and disposing the second dielectric material layer comprises disposing the second dielectric material layer over the substrate and adjacent to the second side of the Fin using flowable chemical vapor deposition.

22. The method of claim 15, wherein:

disposing the first dielectric material layer comprises disposing one or more oxide materials over the substrate and adjacent to the first side of the Fin using flowable chemical vapor deposition; and disposing the second dielectric material layer comprises disposing one or more oxide materials over the substrate and adjacent to the second side of the Fin using flowable chemical vapor deposition.

23. The method of claim 15, wherein:

disposing the first dielectric material layer comprises disposing one or more oxide materials over the substrate and adjacent to the first side of the Fin using high aspect ratio processing; and disposing the second dielectric material layer comprises disposing one or more oxide materials over the substrate and adjacent to the second side of the Fin using high aspect ratio processing.

* * * * *